United States Patent
Gore et al.

(10) Patent No.: US 6,370,254 B1
(45) Date of Patent: *Apr. 9, 2002

(54) AUDIO-VISUAL REPRODUCTION

(75) Inventors: David Norman Gore, West Sussex; Michael Joseph Kemp, Cambridge; Graham John Puddifoot; Edwin Charles Hayton, both of London, all of (GB)

(73) Assignee: Concourse Communications Limited, London (GB)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/749,071

(22) Filed: Nov. 14, 1996

Related U.S. Application Data

(63) Continuation of application No. 08/621,334, filed on Mar. 25, 1996, now abandoned, which is a continuation of application No. 08/030,296, filed as application No. PCT/GB91/01515 on Sep. 5, 1991, now abandoned.

(30) Foreign Application Priority Data

Sep. 11, 1990 (GB) .............................................. 9019857
Jun. 26, 1991 (GB) .............................................. 9113709

(51) Int. Cl.$^7$ .......................... H04R 3/00; H03G 3/00
(52) U.S. Cl. ...................... 381/104; 381/107; 381/96
(58) Field of Search .......................... 381/96, 108, 106, 381/107, 57, 86, 104; 360/73.06; 348/11

(56) References Cited

U.S. PATENT DOCUMENTS

| | | | | |
|---|---|---|---|---|
| 4,216,430 A | * | 8/1980 | Amazawa et al. | 455/219 |
| 4,254,303 A | * | 3/1981 | Takizawa | 381/107 |
| 4,264,924 A | * | 4/1981 | Freeman | 348/11 |
| 4,445,147 A | * | 4/1984 | Kessman et al. | 360/12 |
| 4,553,257 A | * | 11/1985 | Mori et al. | 381/57 |
| 4,771,472 A | * | 9/1988 | Williams, III et al. | 381/107 |
| 5,239,429 A | * | 8/1993 | Hoshi | 360/73.06 |

FOREIGN PATENT DOCUMENTS

| | | | | |
|---|---|---|---|---|
| GB | 2207313 | * | 1/1989 | 381/107 |

* cited by examiner

*Primary Examiner*—Xu Mei
*Assistant Examiner*—Laura A. Grier
(74) *Attorney, Agent, or Firm*—Frishauf, Holtz, Goodman, Langer & Chick, P.C.

(57) ABSTRACT

An audio-visual reproduction system includes an audio signal source, a video signal source and a plurality of audio-visual reproduction devices connected to the audio source and the video source via respective audio and video channels, each such device thereby reproducing combined audio-visual material. Each device includes an automatic audio volume control circuit, and, positioned near the device, an audio transducer generates an output signal in dependence upon ambient noise in the vicinity of the device. The volume control circuit is arranged to apply a level of gain or attenuation in reproducing the audio signal from the audio source responsively to the audio signal level, so as to reduce the effect of the audio signal component within the ambient noise upon the level of gain or attenuation.

6 Claims, 13 Drawing Sheets

FIG. 13

| ADDRESS | DURATION | FOLLOWING STILL |
|---|---|---|
|  |  |  |
|  |  |  |
|  |  |  |
|  |  |  |
|  |  |  |

235

230

AUDIO-VISUAL REPRODUCTION

This application is a Continuation, of application Ser. No. 08/621,334, filed Mar. 25, 1996 (now abandoned), which is a Continuation of Ser. No. 08/030,296, filed May 5, 1993 (now abandoned), which is a 35 U.S.C. 371 National Stage application of, PCT/GB9/01515, filed Sep. 5, 1991.

This invention relates to an apparatus for reproduction of audio-visual material, particularly but not exclusively advertising material, in an environment subject to ambient noise.

It is known to provide, in an acoustic environment such as a large shop or shopping centre, apparatus for reproducing audio-visual advertising material. Such apparatus comprises one or more units each comprising a video tape player coupled to a monitor device displaying the taped material and reproducing the accompanying soundtrack. Generally, people within the environment will not always be watching the display on the monitor. However, their attention may be drawn to the monitor by the accompanying reproduced audio soundtrack.

A number of problems arise in the use of such a system. Firstly, the ambient noise within the environment may rise or fall in volume. A rise in volume may drown out the reproduced audio, so that attention is no longer drawn to the visual display and the apparatus ceases to be effective. On the other hand, a drop in the ambient volume can cause the reproduced audio to become obtrusive and to annoy people within the environment, and cause them to tend to avoid the apparatus and, possibly, the environment (e.g shop) in which it is positioned. Further, staff working within the environment, who will have to listen to the audio-visual material many times, will be fatigued by overloud reproduced audio, leading to reduced working efficiency and job satisfaction.

In the field of audio reproduction in general, several prior art automatic volume control devices are known; for instance, from GB485005, GB2214013, GB2211685, GB2207313, GB2074408, GB2029141 and U.S. Pat. No. 4254303, EP0027519, EP0026929 and WO88/01453. However, none of these relate to audio-visual reproduction apparatus comprising a plurality of distributed audio-visual reproduction stations.

According to the invention there is provided, in one aspect, audio visual reproduction apparatus comprising a common audio source and video source, and a plurality of display terminals each including volume control apparatus for keeping the generated audio level audible with respect to ambient noise in the environment of the device.

In another aspect, the invention provides volume control apparatus, which is arranged to control the gain of an audio amplifier by forming a difference between a signal derived from the amplifier output and a received audio signal from a microphone, the dependence of the difference upon the signal derived from the amplifier output exceeding that on the signal from the microphone so that the device exhibits a degree of compression related to the ambient noise. This is found to increase the acceptability of the volume control to listeners.

In another aspect, the invention provides a visual display system arranged to supply a plurality of output display devices from a common visual source arranged to switch between a plurality of different visual signals; in one preferred embodiment, a plurality of visual signals are stored on a medium and can be replayed in one or more desired sequences therefrom. In this embodiment, preferably, to allow access time between different stored locations on the medium, a second visual signal source (for example, a still picture held in a frame store) is provided between successive stored signals of the sequence.

Other aspects and preferred embodiments of the invention will be apparent from the following description and claims.

The invention will now be illustrated, by way of example only, with reference to the following drawings, in which:

FIG. 13 shows schematically the storage of control information within a control unit of FIG. 12;

Figure 1:
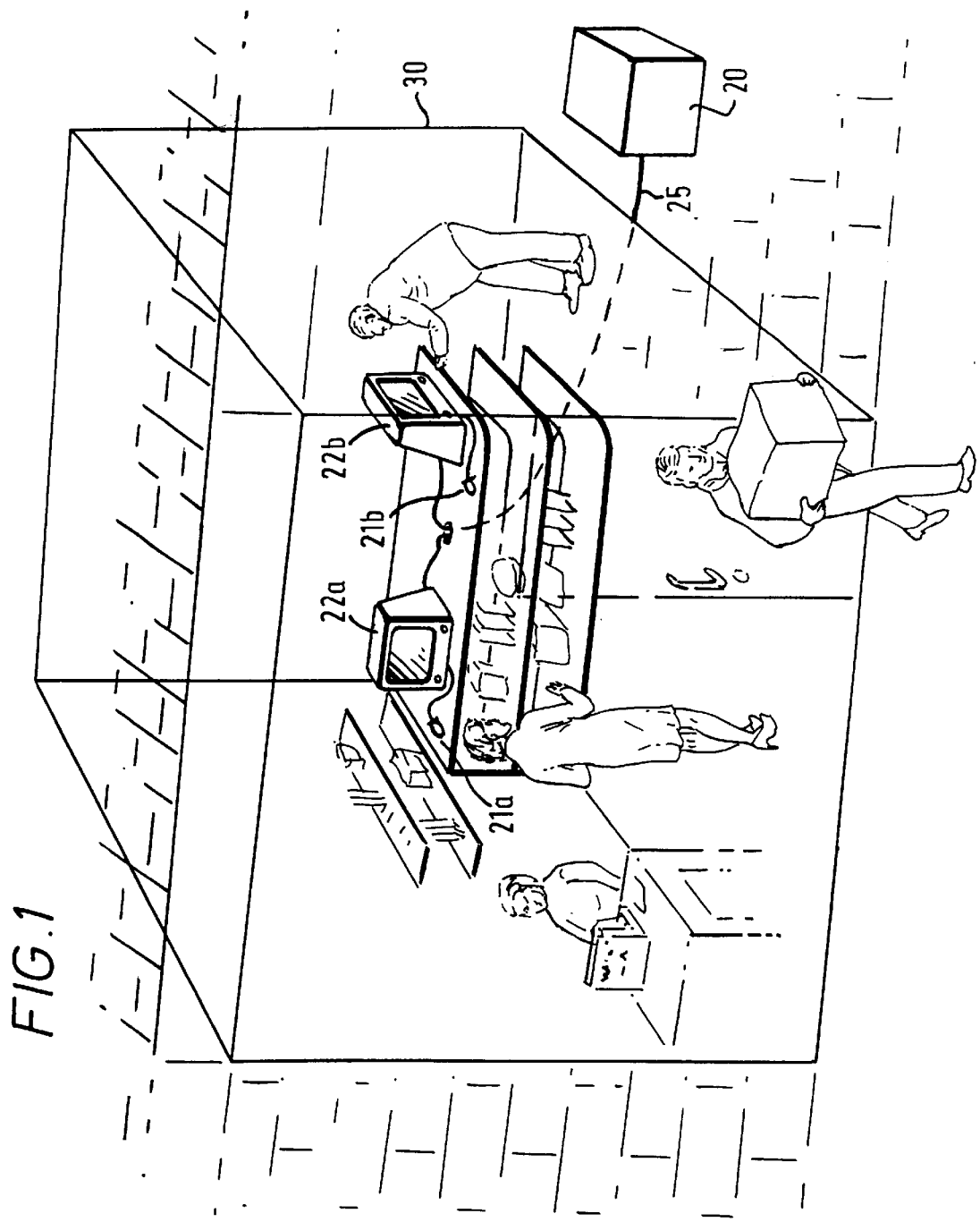
FIG. 1 shows apparatus according to one embodiment of the invention provided in an acoustic environment comprising a room.

Referring to FIG. 1, an acoustic environment 1 comprises a large shopping area 30 comprising one or more rooms. A plurality of monitor units 22a, 22b each comprise a display screen (for example, a cathode ray tube) and an associated audio reproduction loudspeaker. The units 22a, 22b are supplied with a common audio-visual signal through connector cable 25 to an audio-visual signal source 20. The monitor units are conveniently stationed at around eye height, for example by being mounted above display shelf units, or mounted to the wall or ceiling of the room in which they are positioned.

Figure 2:
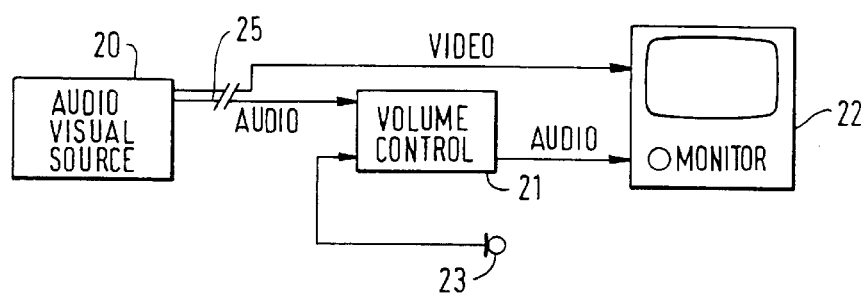
FIG. 2 is a block diagram showing components of FIG. 1 in greater detail.

Referring to FIG. 2, stationed in the vicinity of each monitor 22 is a volume control device 21 connected to receive the audio channel from the cable 25 and to control the volume thereof for supply to a loudspeaker forming part of the monitor unit 22, in dependence upon the signal supplied from a microphone 23 positioned in the vicinity of the monitor unit 22 (in other words closer to one monitor unit 22a with which it is associated than another 22b).

Referring once more to FIG. 1, between 10 and 100 monitor units 22 are typically provided in a large shopping establishment; typically monitor units are spaced apart a distance of 5 to 8 meters, but larger spacings may be employed.

Figure 3:
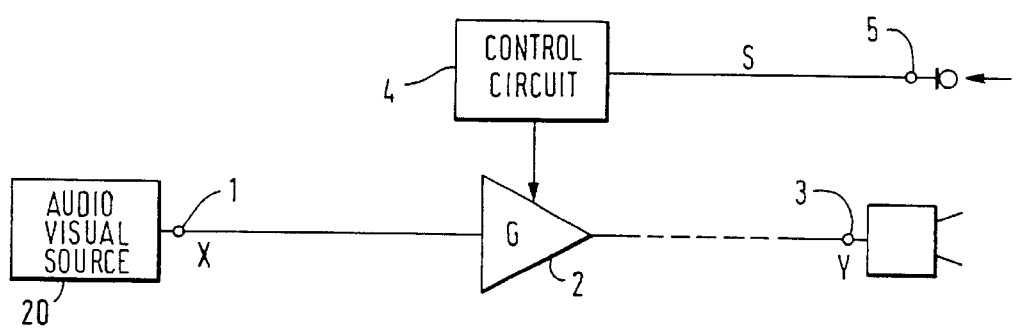
FIG. 3 shows schematically volume control apparatus according to a first embodiment of the invention.

Referring to FIG. 3, in its simplest form the volume control according to a first embodiment of the invention consists of an input port 1, shown connected to the audio source, connected to the input terminal of a controllable amplifier 2, the output port of which is connected to an audio output 3 (shown connected to a loudspeaker) at which the reproduced audio signal is available. A suitable controllable amplifier is the SSM—2013 voltage controlled amplifier available from R.S. Components Ltd, Corby, U.K., but many alternative voltage controlled amplifiers are currently available. The control terminal of the amplifier 2 is connected to a control circuit 4, which has an input port 5 connectable (and shown connected) to a microphone. In use, the control circuit 4 detects the level of ambient sound picked up at the microphone via the input port 5, and supplies a control signal to the amplifier 2 to produce a gain which is monotonically related (for example, proportional) to the detected ambient noise level.

In this embodiment, the control circuit 4 may simply comprise a rectifier circuit, which provides an output signal corresponding to the envelope of the ambient audio noise received by the microphone. Some signal smoothing is also provided (typically by the capacitors within the rectifier), to ensure that sudden ambient noises in the room do not produce dramatic changes in the amplifier gain.

Designating the input audio signal as X; the reproduced, amplified, audio signal as Y; the ambient sound signal received at the microphone as S, and the amplifier gain as G, this may be expressed as:

$$Y=GX;$$

$$G=cS$$

(where c is a constant of proportionality).

As discussed above, in this application, the microphone is positioned in the local audio environment of the monitor, and so the ambient sound signal S which it picks up unavoidably includes a component of the reproduced audio signal Y, processed by the transfer function of the path through the environment between the loudspeaker and the microphone. The principal component of this transfer function for present purposes, is an attenuation factor a. Designating the ambient noise (other than the component due to the reproduced audio signal) as N, it follows that:

$$S=N+aY,$$

and therefore:

$$G=c(N+aY); Y=c(N+aY)X$$

In other words, the gain of the controllable amplifier, and hence the level of the reproduced audio signal, are both proportional to the level of the reproduced audio signal, a condition which will generally lead to runaway audio feedback in which the output audio level rises out of control up to a maximum volume, with perceptually unpleasant consequences for any listeners in the environment). This type of feedback is not audible as a "howl", but as an overall rapid progressive rise of volume level.

Figure 4:
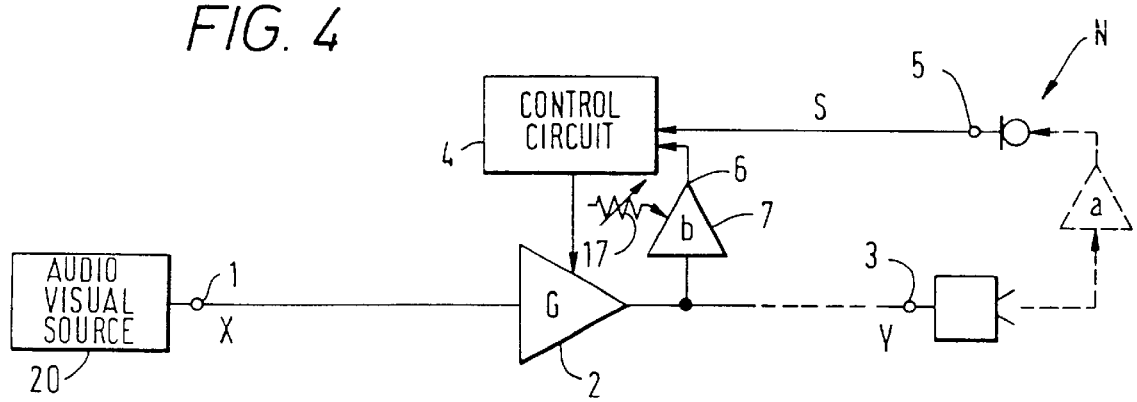
FIG. 4 shows schematically volume control apparatus according to a second, preferred, embodiment of the invention.

Referring to FIG. 4, a preferred embodiment of the volume control circuit employed in the invention arranged to overcome this problem is shown. The acoustic path between the loudspeaker and the microphone is shown dashed. In this embodiment, a feedback path 6 from the output of the controllable amplifier 2 to the control circuit 4 is provided, the feedback path 6 including an element 7 with a gain b.

Figure 5:
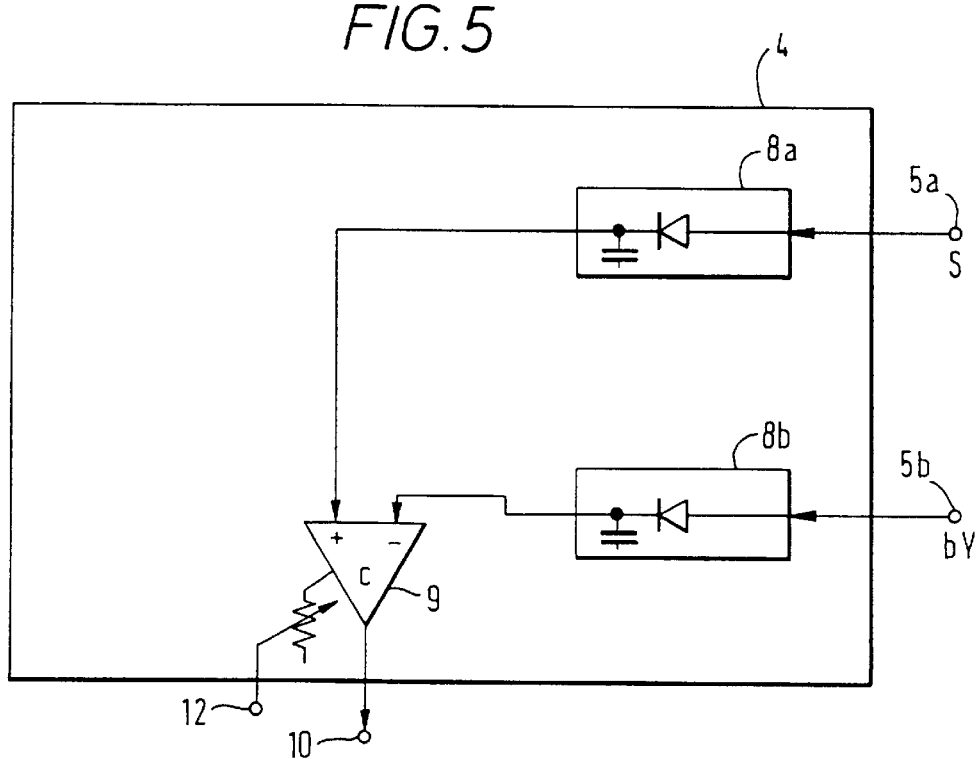
FIG. 5 shows a detail of the circuit of FIG. 4.

Referring to FIG. 5, the control circuit 4 comprises a pair of input ports 5a, 5b; the first is connected to the microphone and the second to the feedback path 6 following the gain stage 7. Each port 5a, 5b is connected to a respective level-extracting circuit 8a, 8b which produces an output signal representing the smoothed audio envelope of the signals received at the ports 5a, 5b. Typically, each circuit 8a, 8b comprises a rectifier with a suitably chosen capacitance. The two level signals thus produced form inputs to a differential amplifier 9 having a gain c (although it will be appreciated that this stage could easily be replaced with a subtraction stage followed by a separate amplification stage), and the output of the amplifier 9 provides a control signal at a port 10 connected to the control terminal of the controllable amplifier 2.

The response of this apparatus can therefore be described as:

$$Y=c(S-bY)X;$$

or $$Y=c(N+(a-b)Y)X$$

If the factor (a−b) is positive, the apparatus will be liable to audio feedback in the same manner as that of FIG. 1 (though to a somewhat reduced degree). If, however, the gain of the component 7 is so selected that this factor is zero, runaway gain feedback is avoided. In effect, the apparatus has estimated the component of the ambient noise which is due to its own output, and subtracted from the ambient noise level a corresponding component so as to reduce (or eliminate) the positive dependence upon its output of the gain of the controllable amplifier 2.

It is possible to envisage other methods of cancelling the reproduced audio component signal from the ambient noise signal. For example, it could be derived from the audio signal at the input 1 to the controllable amplifier 2, but this method is much less effective since the level of this signal does not itself rise and fall with the amplifier gain. Alternatively, for the feedback path 6, a second microphone could be employed, positioned nearer to the loudspeaker (in other words, the feedback path 6 could include an acoustic path).

It will be apparent from the foregoing that the correct operation of the device depends upon matching the gain or attenuation b of the gain stages 7 within the feedback path 6 to the total gain or attenuation a (acoustic and electrical) between the amplifier output port 3 via the loudspeaker, air path, and microphone, to the input port 5 of the control circuit. The acoustic impedance of the path throught the environment depends strongly upon the size of the environment (e.g. room) 30 and the positions and acoustic absorptions of objects (e.g. walls, ceilings, people) within the environment 30.

The preferred method of arranging the apparatus for use in rooms is to set up the apparatus, together with a monitor 22 and microphone 21 connected via a cable 25 to the audio-visual signal source, in their desired positions at a time when the room 30 is quiet; switch on the audio signal source and the apparatus; and vary the gain b of the feedback stage 7 so as to reduce the difference in levels of the envelope outputs of the stages 8a and 8b as discussed in greater detail below. This is conveniently done by monitoring the control circuit output at port 10, to detect a zero level. Alternatively, the gain of the controllable amplifier 2 could be monitored (e.g. by monitoring the relationship between the amplitudes of its input and output signals X and Y).

Accordingly, the gain stage 7 within the feedback loop 6 is provided with a variable gain control 17, which is altered until the feedback gain b matches the acoustic path gain a.

In a particularly preferred embodiment of the system, the gain/attenuation of the feedback path is set to slightly exceed the gain/attenuation a which the acoustic path through the environment will exhibit in use. The effect is then that the gain of the controllable amplifier 2 acquires a negative dependence upon its own output, which produces an audio compression effect reducing the dynamic range of the reproduced audio signal (i.e. the differences in level between loud and quiet signal portions) by an extent proportional to the level of ambient noise N. This is of further benefit in noisy environments, where quiet parts of the reproduced signal would otherwise become inaudible.

This compression effect has several important and advantageous psycho-acoustic consequences. Firstly, at higher noise levels the audibility of the reproduced signal is increased by the compression, without an associated increase in the overall volume of the reproduced sound. This is advantageous in that, since each monitor 22 contributes to the "background noise" sensed by the microphone 21 or other monitors, the extent to which an increase in noise local to one monitor causes an increase in volume of other monitors is reduced which helps keep down the reproduced audio levels throughout the acoustic environment 30. Further, when the noise level is reduced, the amount of compression likewise reduces so that the obtrusiveness of the reproduced material on staff is reduced, and the reproduced audio is more natural sounding.

For further clarification, the operation of the embodiment under the three following conditions:

(i) In the Absence of any Interfering Noise, or where the Noise is Well Below the System Sound (at the Microphone) e.g. at Setup The system can be balanced perfectly (subject to the described slow time constants to match the audio propagation).

(ii) In the Presence of Noise of a Similar Level to the Desired Sound

Where the energy component of the noise roughly equals that of the system sound, (i.e. equal energy at the microphone) the signals experienced at the microphone will be approximately 3 dB above that of in case (i) above. This is because 3 dB represents a doubling in energy (the sum of the two components). This represents an RMS voltage level of about 40% above that of case (i), and a similar figure may be expected of the peak level generated by the rectifier circuits described. This 40% increase is sufficient to be used to increase the gain as described. However it can now be seen that variations in the system's sound are contributing substantially less than half of any variation in the voltage peak levels, and therefore the subtraction system will be generating some compression as described.

(iii) Where Ambient Noise Substantially Exceeds that of the System Sound at the Microphone In this condition, all significant received energy is from the ambient noise, and the acoustically propagated signal from the system's own sound is now not affecting the signal derived from the microphone. Thus the factor "a" of FIG. 4 can be considered to be zero and the internally derived feedback factor b is acting entirely to provide compression.

Further increases in ambient noise raise the overall level of the compressed signal.

The reactive components of the rectifier circuits 8a, 8b are preferably selected to give relatively long time constants (of the order of 0.3–3 seconds, and preferably around 0.5–1 second) to changes in the volume control signal. The nature of the compression applied is therefore relatively slow acting. The time constants are longer than the delay element of the transfer function a of the acoustic environment, and sufficiently long to smooth the effects of brief loudness peaks of the ambient noise N.

Because the presence of people within a room tends to absorb sound (and hence increases the acoustic attenuation, and reduces the transfer function a of the path between the loudspeaker and microphone), and/or because this system may be considered slightly nonlinear (as the volumes of ambient noise N and output signal S are not, strictly speaking, additive) the above described technique of setting the value of the gain b of the feedback path 6, 7 in an empty, quiet room has the effect of setting it to exceed the acoustic gain or attenuation a which that room will exhibit when it contains people and/or when the ambient noise N is high so the above method of calibrating the apparatus of the invention effectively achieves this desired embodiment.

Figure 6:
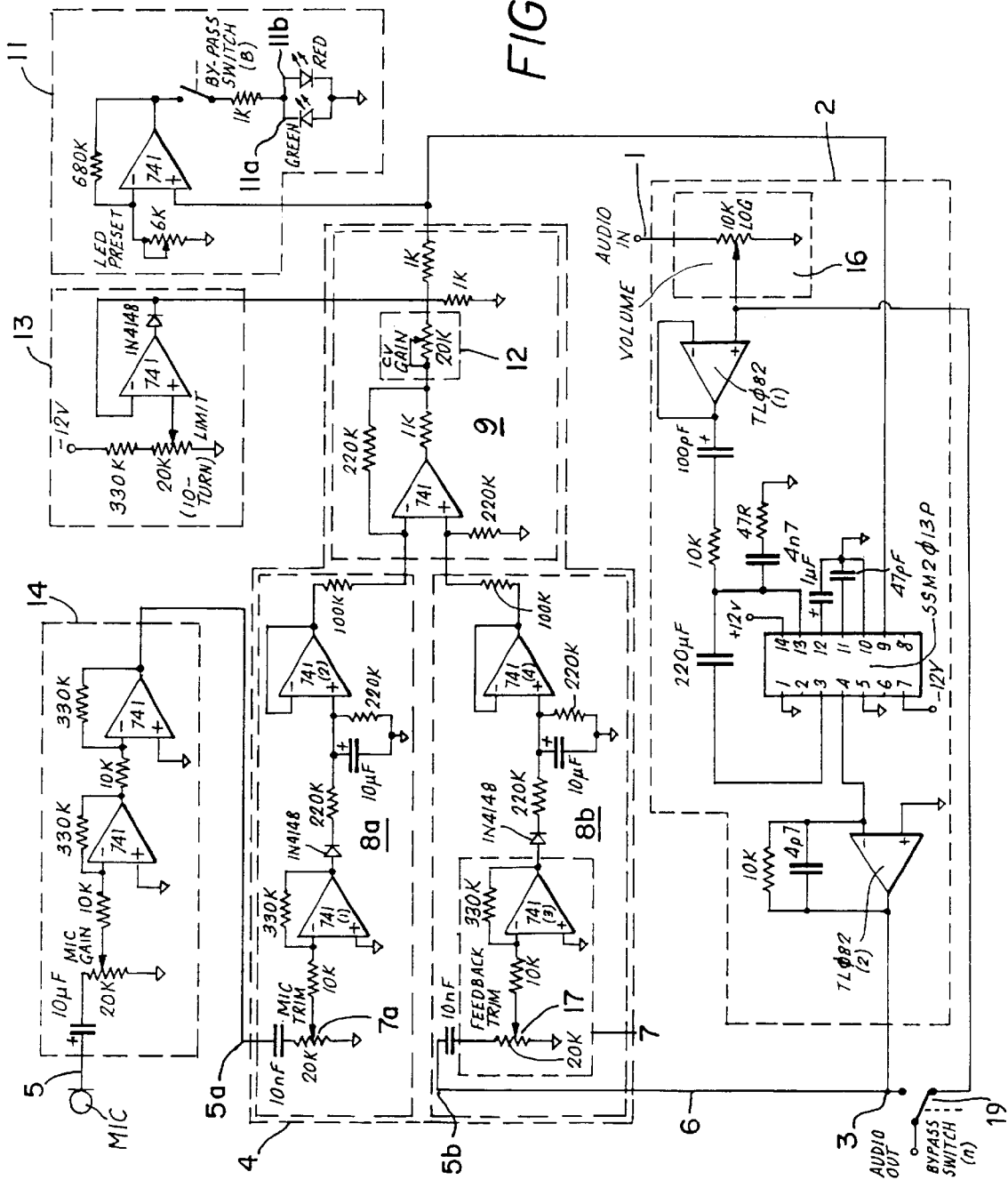
FIG. 6 shows in greater detail the circuit of FIGS. 4 and 5.

As an aid to manually setting the required feedback impedance, an indicator circuit 11 is provided connected to the control circuit output port 10, to give an indication of the normal condition when the control signal at the port 10 is at the desired level; in one embodiment, as shown in FIG. 6, this comprises a pair of LEDs 11a, 11b of different colours, each responsive to a different polarity at the port 10; the red LED 11b indicating that the feedback impedance is too low (and hence the apparatus is potentially liable to feedback), and the green LED 11a indicating that the feedback impedance is too high. A preset-type potentiometer sets the width of the 'dead band' between operation of the red and green LEDs 11a, 11b.

Alternatively, it will be apparent that the control signal from the port 10 could readily be employed as an error signal to automatically derive the correct gain, in a quiet environment prior to use, for example by making the controlling trim 17 of the gain element 7 a motor driven potentiometers Referring to FIGS. 5 and 6, the gain of the differential amplifier 9 is preferably controlled via a control port 12, so that the depth to which the gain of the controllable amplifier 2 is altered by the control circuit 4 may be set.

Also preferably provided is a limiting circuit 13 which limits the maximum gain level that the controllable amplifier can exhibit, to avoid unacceptably high volumes (for example, in the case of an unexpected occurence of runaway gain). Such a circuit may be provided in various ways; that shown involves the use of a clamping diode circuit.

Various modifications are apparent to the man skilled in the art; for example, as shown in FIG. 6, the path from the microphone input 5 to the differential amplifier 9 may contain a controllable electrical gain stage 7a, and instead of varying the gain of the feedback path to calibrate the apparatus, it will be appreciated that the gain 7a and the gain of the differential amplifier 9 could be manipulated to achieve the same effect (although this is in practice less straightforward since the two could not than be independently varied).

Referring to FIG. 6, the apparatus of that embodiment includes various other circuit stages which will not be discussed in detail (for example, a d.c. blocking capacitor and microphone amplifiers 14 within the path from the microphone input port 5 to the control circuit 4; and buffering circuits at other points as necessary). Following the input ports 5a and 5b of the control circuit 4, high pass filter circuits are preferably provided, so as to cut out low frequency components of the ambient sound since these may include standing wave components, which could cause undesired gain fluctuation in the apparatus and due to loudspeaker distortion exhibit the greatest differences from the electrically fed-back signal.

Figure 7:
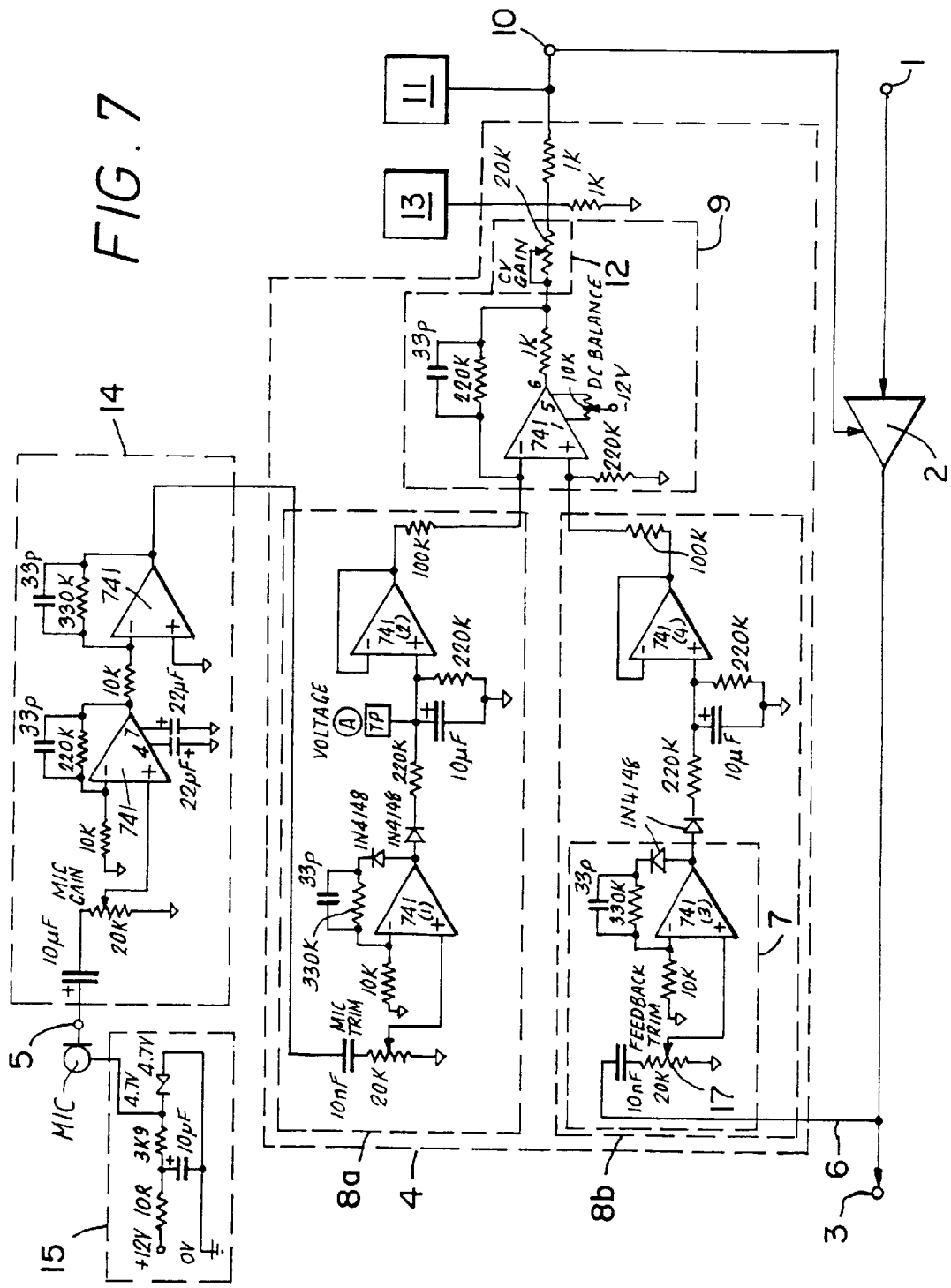
FIG. 7 shows in detail an alternative to the circuit of FIG. 6.

Referring to FIG. 7, an alternative (and preferred) circuit is illustrated with different component values and a power supply circuit 15 suitable for an electret microphone; the circuit components 2, 11, and 13 have been omitted since these are identical to those of FIG. 6. The rectifier circuits within the stages 8a, 8b comprise so-called "perfect rectifiers"; a diode in the feedback path of each op-amp circuit matches the rectifying diode and produces a more accurate output.

A bypass switch 19 is provided to enable the audio input to the device to be selectively switched to the audio output, isolating the output of the amplifier 2 therefrom.

Also provided is an audio input volume control circuit 16 (shown in FIG. 6), to enable a user to raise or lower the overall volume level. It is important not to use a further volume control in this embodiment between the audio output 3 and a loudspeaker after deriving the correct feedback gain value, since this will vary the level of reproduced audio signal within the environment without also varying the level through the feedback path 6. Where the invention is intended for use in public environments such as shops, the volume control circuit is preferably lockable, or otherwise arranged to prevent unauthorised tampering during use.

Many monitor units include a voltage controlled amplifier to control the audio level. One possibility would be to supply the control signal from the control circuit 4 directly to the control terminals of the voltage controlled amplifier provided in the monitor itself.

In one type of monitor unit, the audio path comprises a level control stage, providing a controlled degree of amplification or attenuation of the audio signal in dependence upon a volume control comprising, for example, a receiver arranged to receive a control signal from a remote volume control device communicating therewith by infrared or ultrasonics; and a second stage providing any further desired audio processing such as pseudo-stereo enhancement, and buffering the audio signal for output to a loudspeaker in the monitor. Conveniently, in this type of monitor, the volume control device described above is positioned to receive as its input, the output of the first stage, and its output is connected to the second stage.

The volume control provided with the monitor itself may then replace the audio input volume control circuit 16. It is found that where a psuedo-stereo monitor is employed (i.e. one which receives a monophonic signal and generates two different output signals—for example, in phase quadrature or antiphase to each other, or mutually delayed), monitors may be located closer together without each causing the other to generate a runaway volume level.

References in the text to "gain" and "amplification" or "amplifiers" should be understood to include gain values (Y/X) which are less than unity—i.e. attenuations.

Although the circuit described involves cheap and readily available analogue components, digital implementations of the invention are straight forward from the foregoing.

The component values indicated in FIG. 7 are chosen to give correct operation around the centre of the preset ranges. A list of components for the device shown in FIG. 5 is:

| COMPONENT LIST |
| --- |
| INTEGRATED CIRCUITS |
| 5 off 741 (8 pin) |
| 1 off 4741 (14 pin) |
| 1 off TL082 (8 pin) |
| 1 off SSM2013 (14 pin) |
| 8 |
| RESISTORS |
| 1 off 10R |
| 1 off 47R |
| 4 off 1K |
| 1 off 3K9 |
| 6 off 10K |
| 2 off 100K |
| 7 off 220K |
| 4 off 330K |
| 1 off 680K |
| 27 |
| DIODES |
| 1 off Zener 4.7V/500 mW |
| 1 off l0mA LED (red) |
| 1 off 10nA LED (green) |
| 1 off 1N4148 |
| 8 |
| CAPACITORS |
| 6 off 33 pF |
| 1 off 47 pF |
| 1 off 220 pF |
| 1 off 4n7 |
| 2 off 10 nF |
| 1 off 1uF |
| 4 off 10uF |
| 2 off 22uF |
| 1 off 100uF |
| 20 |
| PRESETS |
| 4 off 20D |
| 1 off 20K (10-turn) |
| 1 off 10K |
| 1 off 5K |
| 7 |
| MISCELLANEOUS |
| 1 off stereo jack socket |
| 1 off DPDT switch (on-on) |
| 1 off 10K Log Pot (lockable) |

Figure 8A:
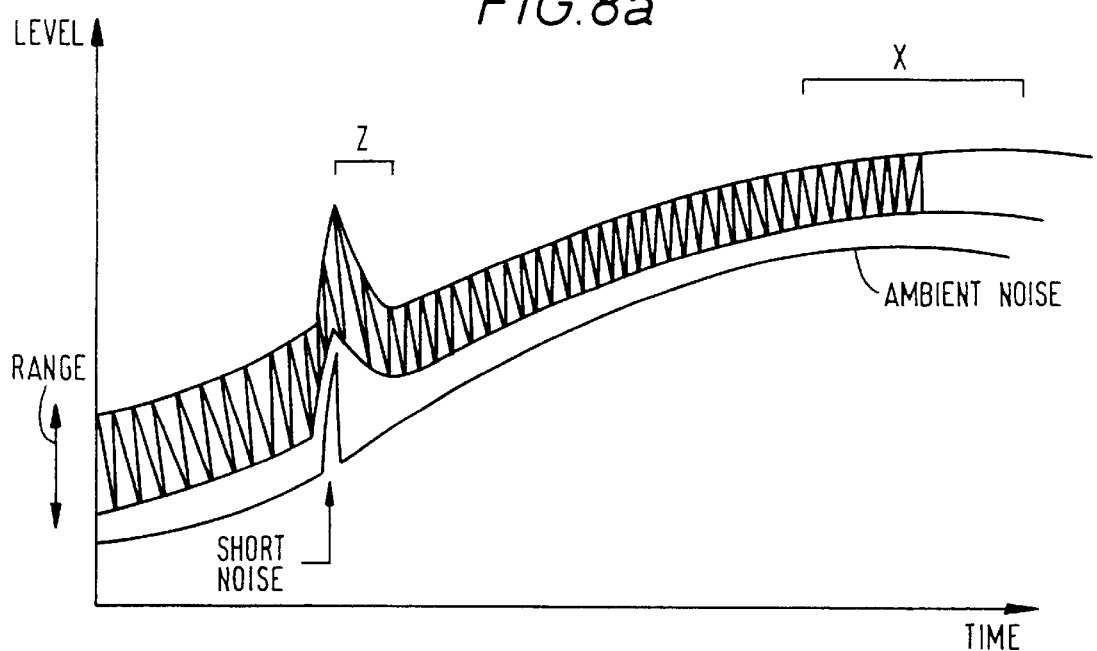
FIGS. 8a and 8b shows schematically the audio level produced by two different embodiments of the arrangement of FIG. 4.

One particular situation which arises in shopping areas is occasional shortlived loud sounds such as children shouting. It is found that customers are generally used to, and accept, such short term noises. However, if the time constants in the rectifiers 8a, 8b are relatively short the gain of the amplifier 2 will be increased on occurrence of such a loud sound, and it is found that the corresponding increase in volume of reproduced material is much less acceptable; the acceptability is further reduced by the fact that the increase in volume persists for a short while after the cessation of the loud noise, due to the rectifier time. constants. Referring to FIG. 8a, it will be seen that, in the period z, a short spike of loud ambient noise produces a longer lived corresponding increase in reproduced sound. For reference, in the time period x, as shown, with a higher level of ambient noise there is a certain amount of compression of the reproduced sound range but the maximum level of the reproduced sound may still be perceived as too loud.

Figure 8B:
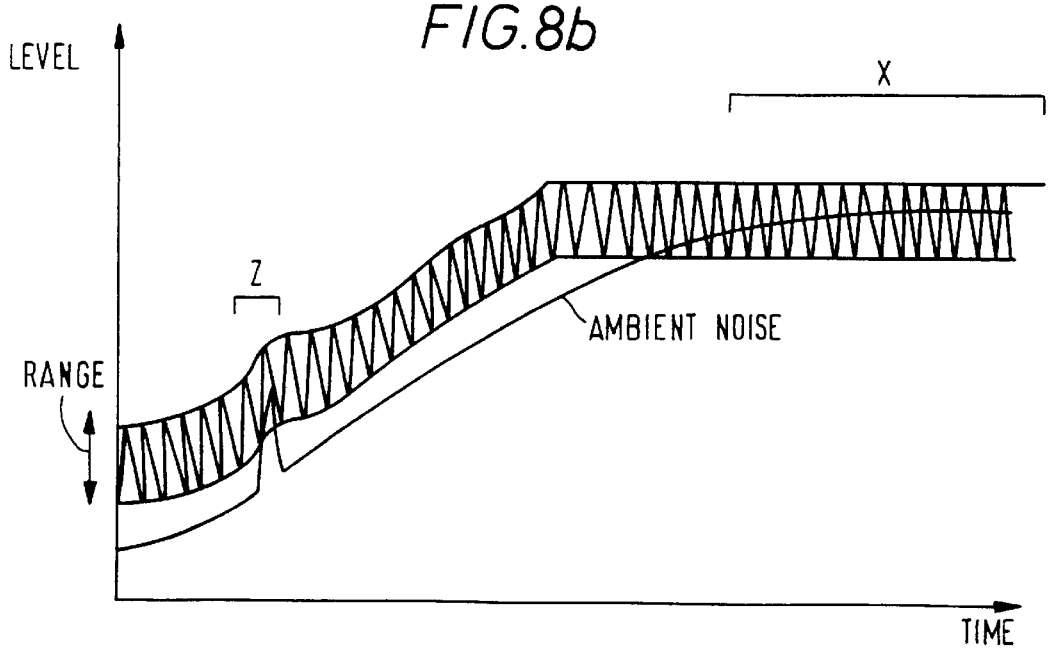

One potential solution to this problem is to increase the length of the time constants of the rectifiers 8a, 8b. However, with longer time constants (on the order of several seconds) the above noted beneficial compression effect is greatly reduced. Referring to FIG. 8b, in which the same (constant amplitude) reproduced audio signal is shown, it will be seen that with such longer time constants the effect of the short noise of the interval z is greatly reduced.

When, as discussed above, a maximum gain limiting circuit 13 is provided with this embodiment, because of the reduced level of compression, if the gain threshold is set at an appropriate level only the loud parts of the reproduced sound may be audible over the ambient noise, making the reproduced audio as a whole hard to listen to.

Figure 9:
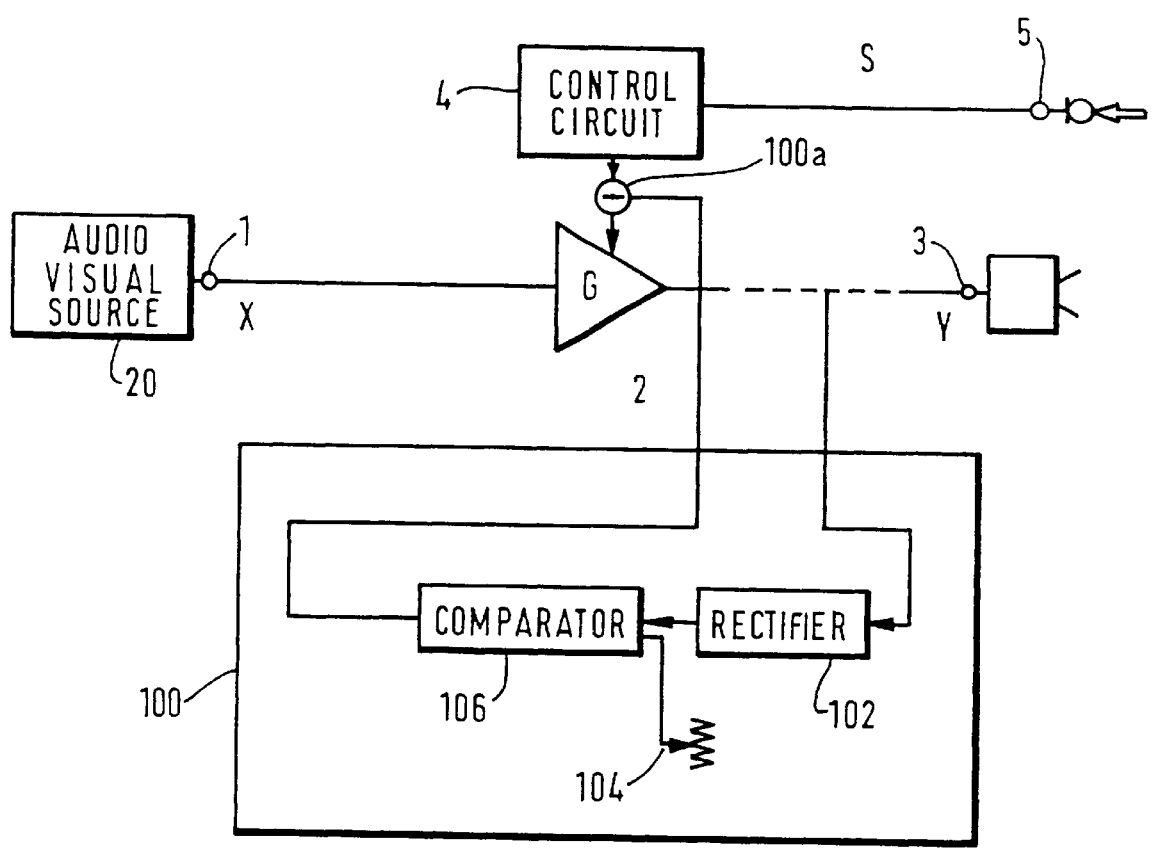
FIG. 9 shows schematically the arrangement of an audio reproduction circuit according to a further embodiment of the invention.

Referring to FIG. 9, accordingly, in a further embodiment of the invention there is provided a separate range controlling circuit 100, 100a which is responsive to the reproduced audio output of the reproduction circuit to generate a gain reducing signal when the output exceeds a predetermined level. The circuit comprises a rectifier 102, rectifying the output of the amplifier/attenuator 2; a threshold signal generating circuit 104; and a comparator 106 receiving the signal from the rectifier 102 and threshold generator 104. The output of the comparator 106 is supplied to the subtractor 100a at which it is subtracted from the signal from the control circuit 4 to provide a signal for controlling the amplifier/attenuator 2. In this embodiment, the controlled amplifier 2 is arranged to attenuate when fed with a negative control signal and to amplify with a positive control signal.

In operation, the threshold signal is set to a level corresponding to a relatively loud perceived reproduced sound level. The comparator 106 is arranged to generate a zero output when the signal from the rectifier 102 is less than the threshold signal. When the signal from the rectifier 102 is greater than the threshold signal, the comparator 106 produces a positive output corresponding to the difference in levels of the two. This output is subtracted from the gain control signal from the control circuit 4 at the subtractor 100a, to reduce the gain of the amplifier 2 and hence reduce the level of the output thereof. Any further increases in amplitude of the output signal produce further corresponding decreases in gain, so that the effect of this negative feedback arrangement is to produce a well controlled limit on the absolute amplitude of the reproduced audio signal, independent of ambient noise. When the reproduced audio signal is at a lower level than the threshold, the circuit 100, 100a has no effect.

Figure 10A:
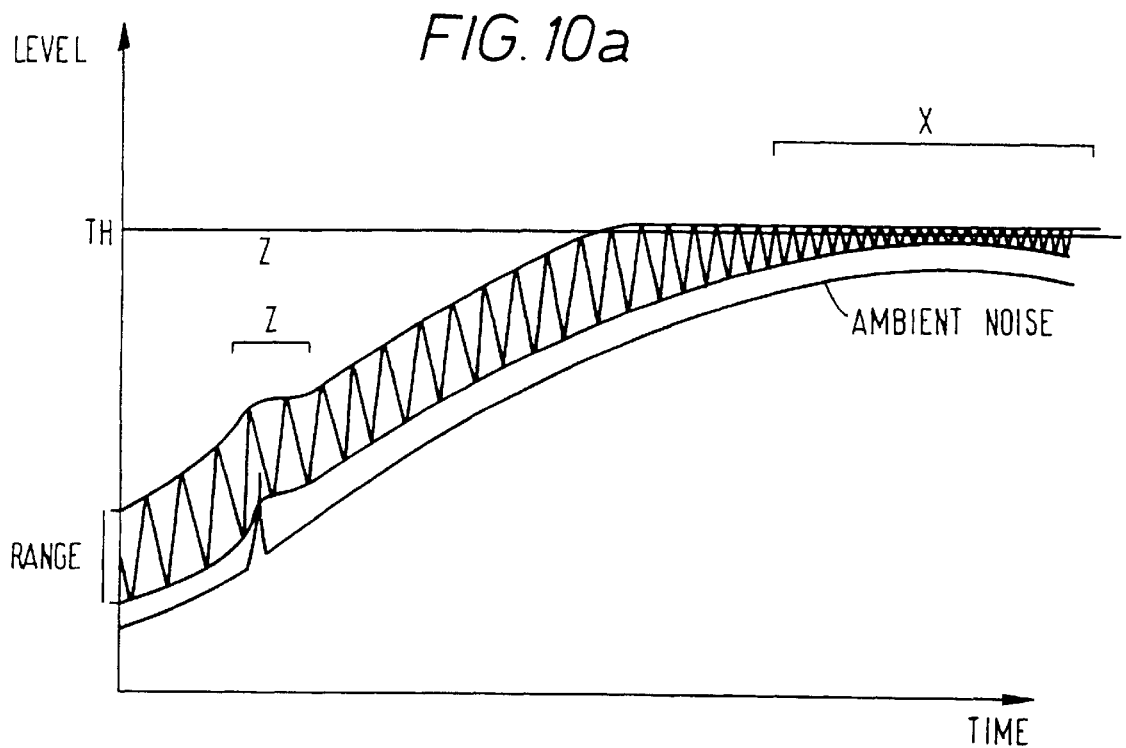
FIGS. 10a and 10b shows schematically the audio levels produced by embodiments of the arrangement of FIG. 9 corresponding to FIGS. 8a and 8b.

Referring to FIG. 10a, the effect of this embodiment of the invention is, as shown to limit the maximum level of the reproduced audio signal to the threshold produced by the threshold level generator 104. In the absence of ambient noise, the threshold is set at a level well above any normally reproduced audio level and consequently the circuit 100, 100a is without effect. For low levels of ambient noise, this embodiment behaves like that of FIG. 8b or FIG. 8a (depending upon the time constants of the rectifiers 8a, 8b). However, as the ambient noise increases towards the region x, the control circuit 4 causes a generally linear gain increase as described above. At some point, the reproduced signal exceeds the threshold level and the circuit 100, 100a commences to vary the gain control signal so as to pull down the level of the louder parts of the reproduced signal. The time constants of the rectifier 102 are such that the signal from the comparator 106 varies relatively rapidly (for example the time constants may be on the order of a few milliseconds attack, a few hundred milliseconds decay). Accordingly, the range of the reproduced signal is compressed; since the upper level of the reproduced signal is fixed at the threshold level, the amount of compression varies according to the ambient noise so that as the ambient noise increases the compression likewise increases as shown in FIG. 10a. This noise dependant compression increases the audibility of the signal at high ambient noise levels without increasing its peak volume, which is found to be subjectively relatively acceptable to listeners. Accordingly, in this embodiment, the gain limiting circuitry 13 described in FIG. 6 is unnnecessary.

Figure 11:
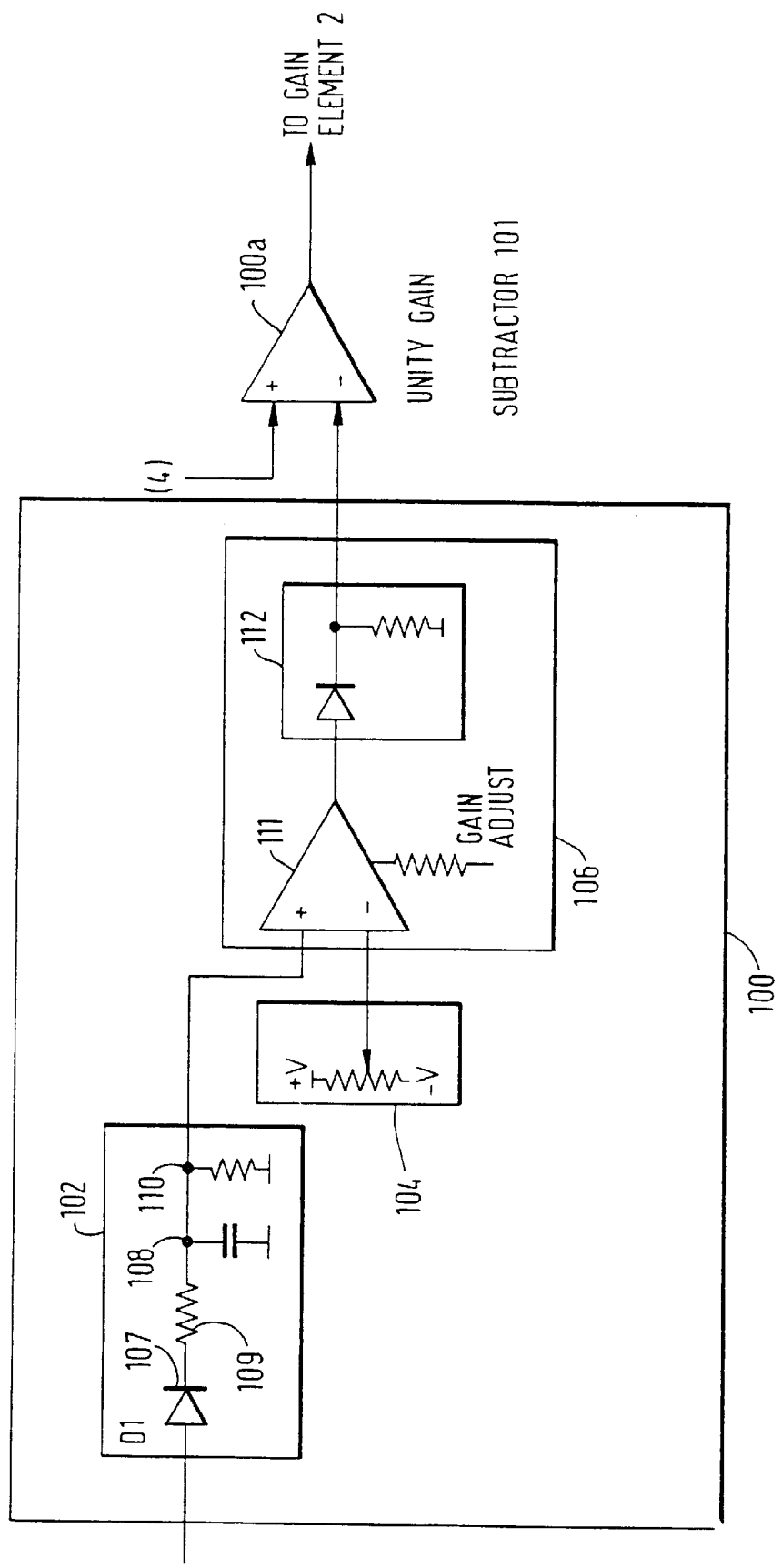
FIG. 11 shows in greater detail the embodiment of FIG. 9.

Referring to FIG. 11, the rectifier 102 may be a simple diode 107 followed by a capacitor 108 which, together with a series resistor are 109, provides a time constant of attack (a few milliseconds) which determines the speed at which gain is reduced as a sudden loud reproduced audio signal is generated and which, in combination with a parallel resistor 110, determines the "decay" time constant at which the gain level is restored after cessation of the loud output signal.

The threshold signal generating circuit 104 may simply comprise a potentiometer connected between a potential levels +v, −v.

The comparator 106 may be implemented by a gain controlled operational amplifier 112. The operational amplifier 111 is connected at a differential amplifier and consequently when the signal from the rectifier 102 is below the threshold, the output of the operational amplifier 111 is negative and is blocked by the rectifier 112. On the other hand, when the output of the rectifier 102 exceeds the threshold a positive output is passed which traverses the rectifier 112 and is supplied to the subtractor 100a, which may comprise a differential amplifier 106 having unity gain so as not to disturb operation of the control circuit 4.

The rectifiers 102, 112 are shown as diodes, but both may alternatively be provided as "perfect rectifiers" known in the art and described above; the rectifier 102 may additionally be a full wave rectifier.

The gain of the operational amplifier 111 or, in general, the circuit 100, 100a, is an important factor; if the gain of the circuit 100, 100a is high, the effect is as shown in FIG. 10a to limit the peak value of the reproduced audio signal almost completely to a predetermined level. On the other hand, if the gain is set low, the output signal level may continue to rise somewhat if the input signal rises, although with a reduced incremental gain above the threshold level.

Figure 10B:
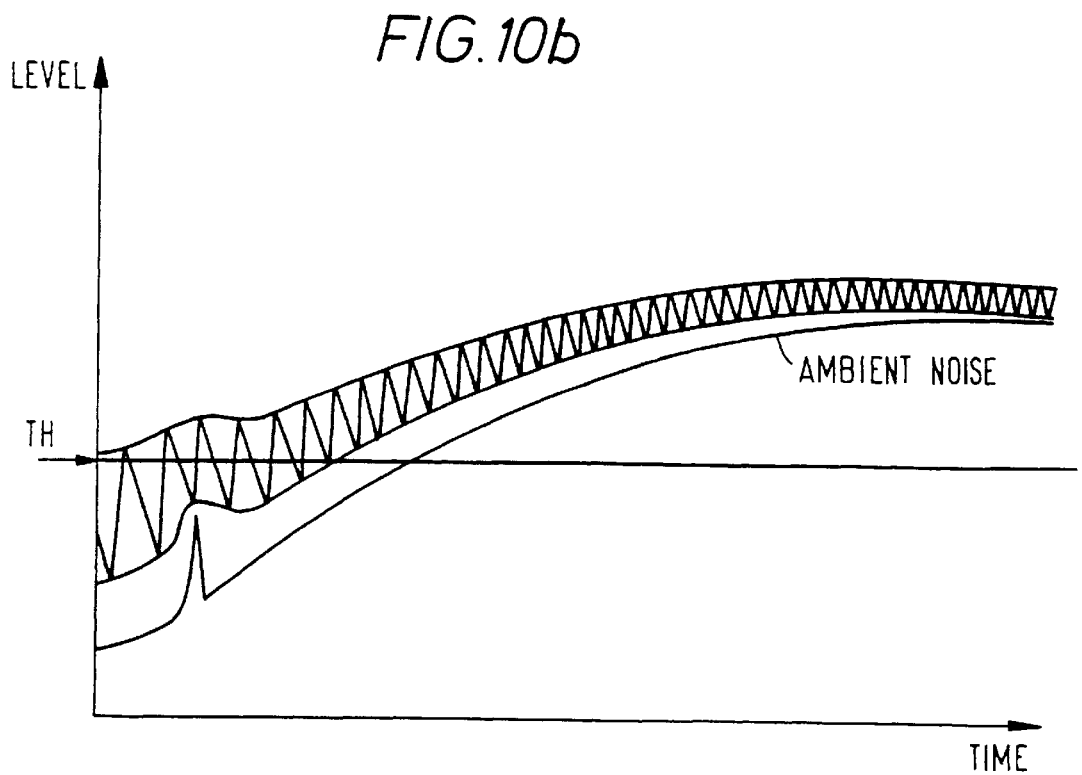

In practice, an intermediate gain level is found to be suitable; referring to FIG. 10b, when the threshold is exceeded, a progressively increasing amount of compression is applied to the reproduced signal. This is preferred as when higher gains are used with relatively long decay time constants, a sudden increase in the audio signal to be reproduced can produce a sudden reduction of gain in response, which only slowly recovers; this "overshoot" effect is found to be undesirable. For example, in a preferred embodiment, the gain is chosen to cause the reproduced audio output level to rise by approximately 1 dB for each 10 dB increase in level at the input 1, to be set when the gain reduction due to the circuit 100a is approximately 20 dB.

This embodiment of the invention is found also to improve the operation of the above described volume control circuit 4, since very loud reproduced outputs are prevented which might otherwise cause instability, or masking of the ambient noise, in the circuit of FIG. 4.

To set up the circuit 100, the threshold is set initially high so that the circuit 100 has no effect. The volume control circuit 4 is then balanced in quiet conditions. The threshold level is then adjusted to a desired peak limit, to the test of the operating personnel. It may be preferred to make the peak limit control the only control available to unskilled personnel in preference to a volume input level control, to prevent the programme material being silenced by being turned down too low.

The embodiment of FIG. 11 is preferably used with that of FIG. 7, from which the limit circuit 13 is removed.

Figure 12:
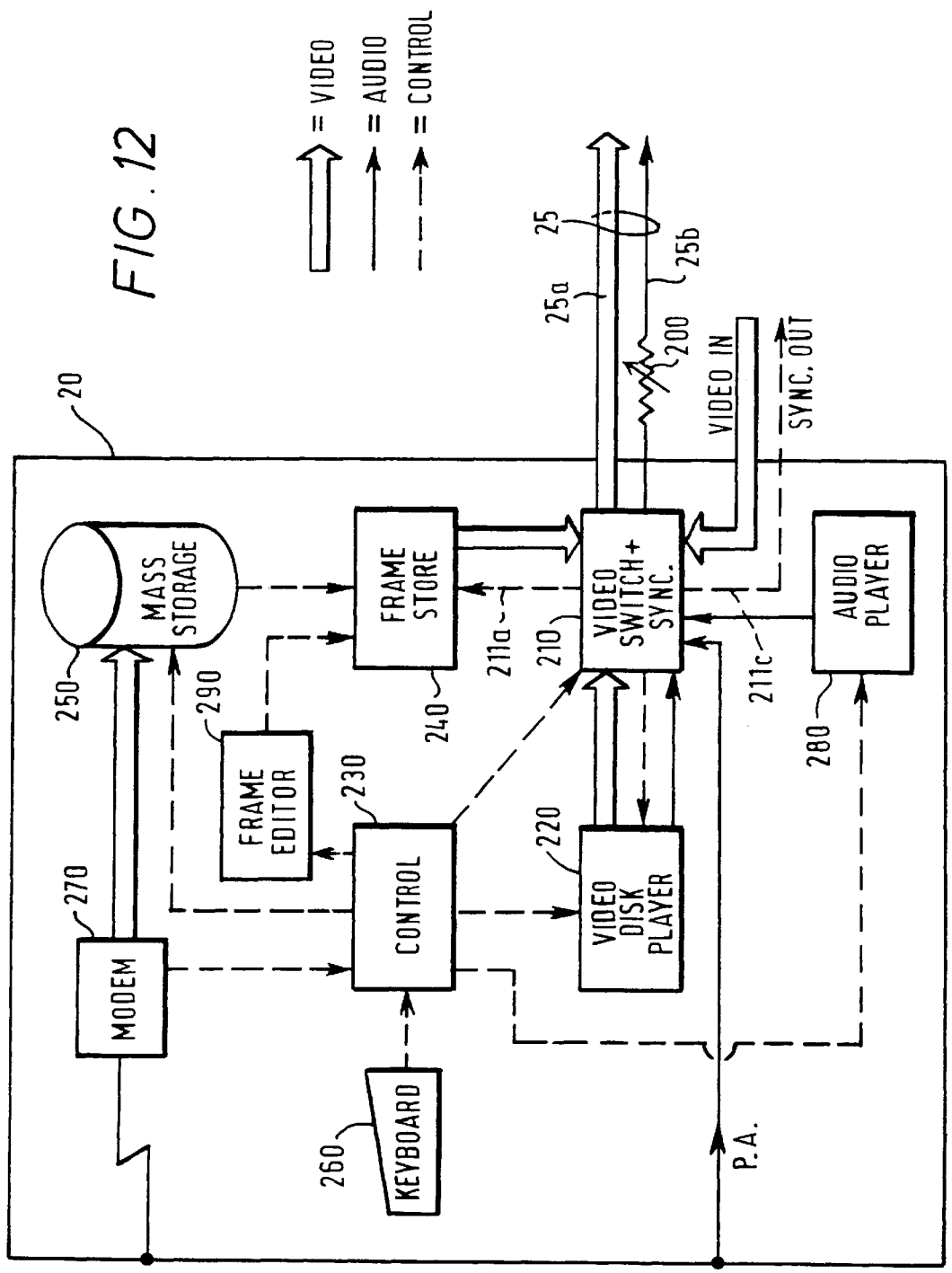
FIG. 12 shows schematically the arrangement of an audio visual source unit according to a preferred embodiment of the invention.

Referring to FIG. 12, the audio-visual source 20 will now be described in greater detail. The output cable 25 comprises a video cable (for example, a coaxial cable) 25*a*, and an audio cable 25*b*. Both cables are connected to respective video and audio output ports of a switching unit 210 (for example, the RS103 unit made by VIDEOTEC available in the UK through Akron Ltd) arranged to select between a plurality of video sources and/or a plurality of audio sources. Associated with the switching unit 210 is a synchronisation signal generating unit, which supplies frame and line synchronising signals to the video sources so that the video switch 210 can switch between images without interference, or delay due to resynchronisation. Synchronisation output lines 211*a*–211*c* are therefore provided to each of the video sources.

A first video source comprises a moving image store 220 arranged to generate a video output comprising a succession of stored video frames. Although a video cassette player could be employed, it is particularly preferred to employ a player of the type in which video data is stored in a plurality of tracks, addressable in response to a digital address signal, giving substantially random access. One example of such a device is the LDP 1500 video disc player available from Sony Corporation. This provides the advantage that different moving picture sequences stored on different parts of the storage medium (e.g video disc) can be rapidly accessed; a typical track to track access time is under a second, whereas if a sequential storage device such as a video cassette player is employed, a time consuming rewinding operation may be necessary when it is desired to move from one moving picture sequence to another.

One currently available video disc for use in such a player 220 is formatted to store up to 35 minutes of video information (in other words, for a frame rate of 30 frames per second, 63,000 video frames) and, associated therewith, two separate audio tracks (normally used for stereo recording). The frames of video information are addressable by the video disc player in dependence upon a frame address specifying the location on the video disc at which each frame is recorded; the video disc player has a control input port arranged to accept frame addresses.

Coupled to the control input of the video disc player 220 is a control unit 230, comprising for example a personal computer, providing an address to the video disc player 220. Referring to FIG. 13 the control unit 230 includes a stored sequence table comprising a list of addresses of sequences to be played by the video disc player 220 together with data indicating the duration of each such sequence. The control unit 230 supplies an address to the video disc player, causing the video disc player to generate a video output corresponding to the sequence which starts at the given address. The control unit 230 then waits for the expiry of the duration time associated with that sequence and address, and thereafter reads the next address from the stored sequence table 231 and sends that address to the control port of the video disc player 220 in the same way.

A second type of video signal source comprises a frame store 240 comprising a read/write memory sufficiently large to hold digital data relating to a frame of a video image, and means for sequentially reading out the stored data and producing therefrom an analogue video signal supplied to the video switch 210.

The video switch 210 may be connected to receive inputs from further video sources, for example to a video input port connectable to a camera and supplied with the video synchronisation signal from the synchronising unit. The camera may be positioned within the store; for example, it could comprise part of the security system, so that overnight the security camera display may be shown throughout the store (possibly as part of a sequence).

The control unit 230 is connected to the switching unit 210 to control the switching thereof between the respective video sources 240, 220. Each such video source device may have an associated audio output, selected by the switch unit 210 together with the video output of each video source device. However, it is preferred that the switch unit 210 should be capable of selecting an audio input from a plurality of audio inputs to be connected to the audio output cable 25*b* independently of the selection of a video input.

In one particularly preferred arrangement, interruption of the image shown on the monitors 22 whilst the moving picture store 220 is switching, under the control of the control unit 230, between one sequence and another is avoided by providing that the control unit 230 instructs the switching unit 210 to select an alternative video source whilst the moving picture store 220 is preparing to access the next sequence. The other video source could be a further moving picture source such as a further video disc player, so that the two video disc players were alternatively switched by the switch unit 210, but it is found more convenient to maintain a still picture video output from the frame store 240 when the track to track access time of the moving picture source 220 is such that the timed change between sequences is short (as is the case with a video disc player).

The frame store 240 is connected to be written to from the output of a mass storage device 250 capable of holding a plurality of stored image frames; for example, a hard disc drive such as the plug-in drive supplied with the Tandon 286 computer which may provide the control unit 230. The address input of the hard disc drive 250 is connected to the output of the control unit 230, so that by selecting an appropriate image stored in the mass storage unit, the contents of the frame store 240 can be determined from the control unit 230. The sequence table 235 held by the control unit 230 therefore also includes, for each entry, an indication of the address within the mass storage unit 250 of the still frame to be displayed after each moving picture sequence has finished, until the next commences. Typically, the frame to follow each moving picture sequence may correspond to the last frame of that sequence. Alternatively, a predetermined frame representing, for example, the name of the shop in which the apparatus is located may be supplied to the frame store 240 for display between sequences.

To enable the order in which the stored sequences supplied from the moving picture store 220 are displayed to be changed, the control means 230 may be arranged to accept input control signals to rewrite the contents of the sequence table 235. For example, a keyboard unit 260 or other manually operable input unit may be provided and connected to the control unit 230. Alternatively, a modem unit 270 connectable to a telecommunications channel may be connected to the control unit 230 to provide control signals therefor.

An audio signal source 280 may be provided comprising, for example, a cassette tape player arranged to continually play a cassette of background music by playing, in succession, both sides of a cassette tape. The background music may be switched by the switcher unit 210 onto the audio output cable 25*b* to accompany a selected still picture from the frame store 240, for example.

It will periodically (for example, every few months) be desired to change the audio visual material displayed. Accordingly, updated moving picture sequences may be supplied by supplying new discs for the video disc player 220, together with, if necessary, a new reproduction sequence for the sequence table 235 via the modem 270. The still images stored in the mass storage unit 250 may be interchanged; for instance, if the mass storage device 250 is a hard disc drive of the type referred to above, a replacement disc drive assembly may be supplied. Alternatively, replacement still image information may be written to the mass storage device 250 from a telecommunications channel via the modem 270.

One type of audio visual advertising display comprises a still picture supplied from the frame store 240, accompanied by a sound track. A convenient way of storing a plurality of sound tracks for this purpose is to store the sound tracks on the second audio channel of discs replayed by the disc player 220. The switch unit 210 is arranged, in this embodiment, to select only the audio output of that channel of the video disc player 220 together with the video output of the frame store 240. The control unit 230 generates the address on the video disc at which the audio sound track is stored, and supplies an appropriate selection signal to the mass storage device 250 and switch unit 210. Typically, the still image within the frame store 240 will show a picture of the product to be advertised together with price information and/or information relating to any special offers. Since this information may vary between different shops and over time, it is preferred that the picture data stored in the mass storage device 250 does not include such information.

Figure 14:
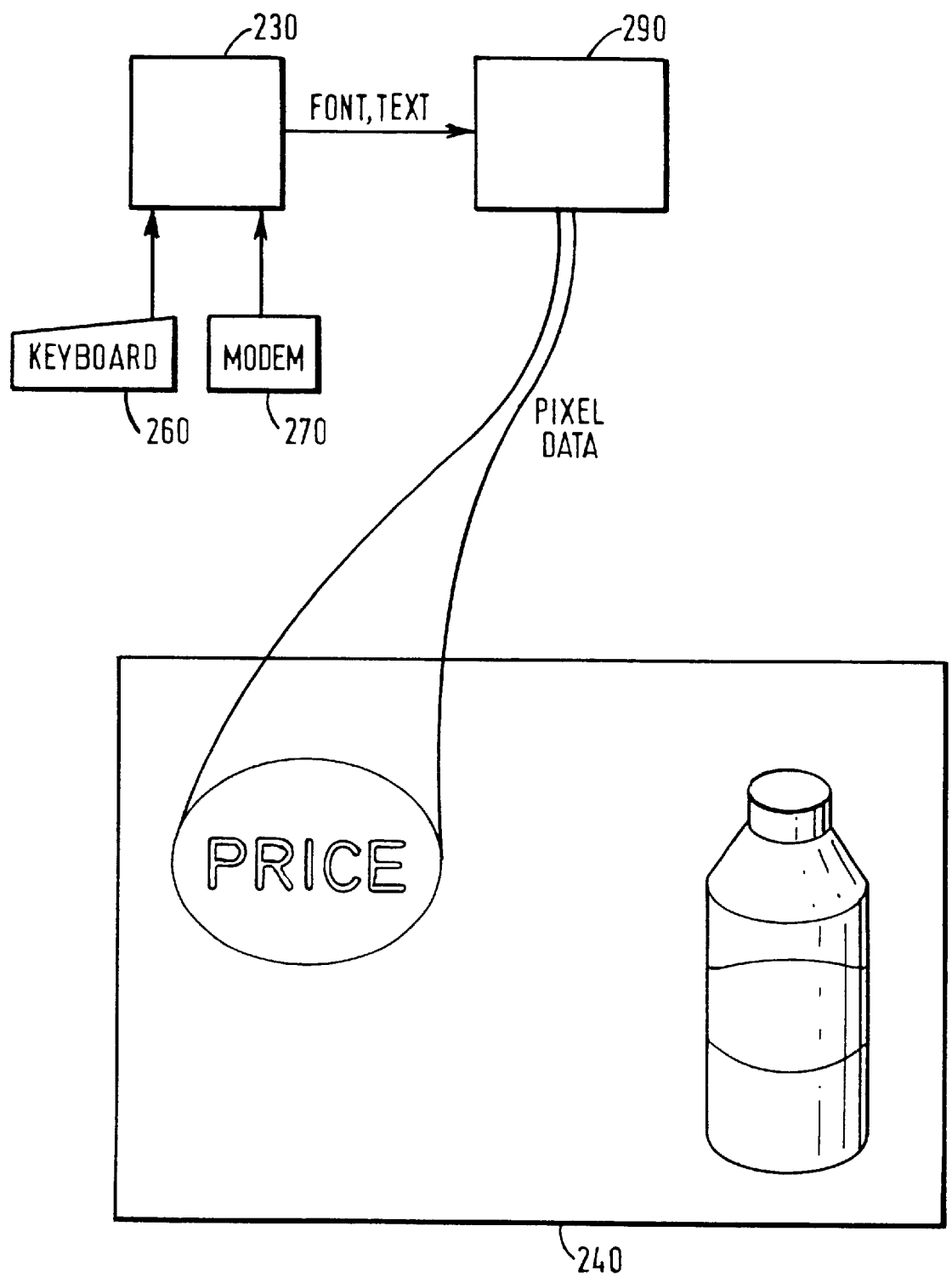
FIG. 14 shows schematically the operation of frame editor of FIG. 12.

Referring to FIG. 13, an image excluding such textual information is therefore written from the mass storage device 250 to the frame store 240. The textual information, together with information relating to the manner in which it is to be presented (for example, the font and size required) is stored within the control unit 230. A frame editor unit 290 is provided which accesses the stored textual information, generates therefrom image data representing the textual information and stores the image data within the frame store 240 overlaying the image data previously stored therein from the mass storage device 250, so as to write the textual information required into the image therein, as shown in FIG. 14. The textual information together with the information determining the manner in which it is displayed may be input to the control unit 230 via a keyboard 260 or modem 270. Preferably, the frame editor 290 is arranged to write the information into the frame store 240 in such a way as to avoid the well known aliasing or rastering effect which produces visually undesirable hard edge lines. The frame editor 230 may typically comprise the control unit 230 operating under stored program control.

A volume setting potentiometer 200 may be provided within the audio output cable 25b to regulate the overall volume level supplied to the monitors 22.

Since in the above described embodiment, a number of different and separately recorded audio signals are employed, the levels of such audio signals may vary over time. It is found that the compression effect noted above can assist in increasing the acceptability of such volume variations to the listener.

If desired, the audio visual apparatus may be connectable to a public address system so as to enable predetermined messages (indicating, for example, that the store is shortly to close) to be given. Alternatively, such predetermined messages may be stored in an audio store (for example, within the audio visual store 220), and the control means 230 may be arranged automatically to control the selection of such messages; typically together with a corresponding display (for example, a still picture stored in the mass storage device 250).

Figure 15:
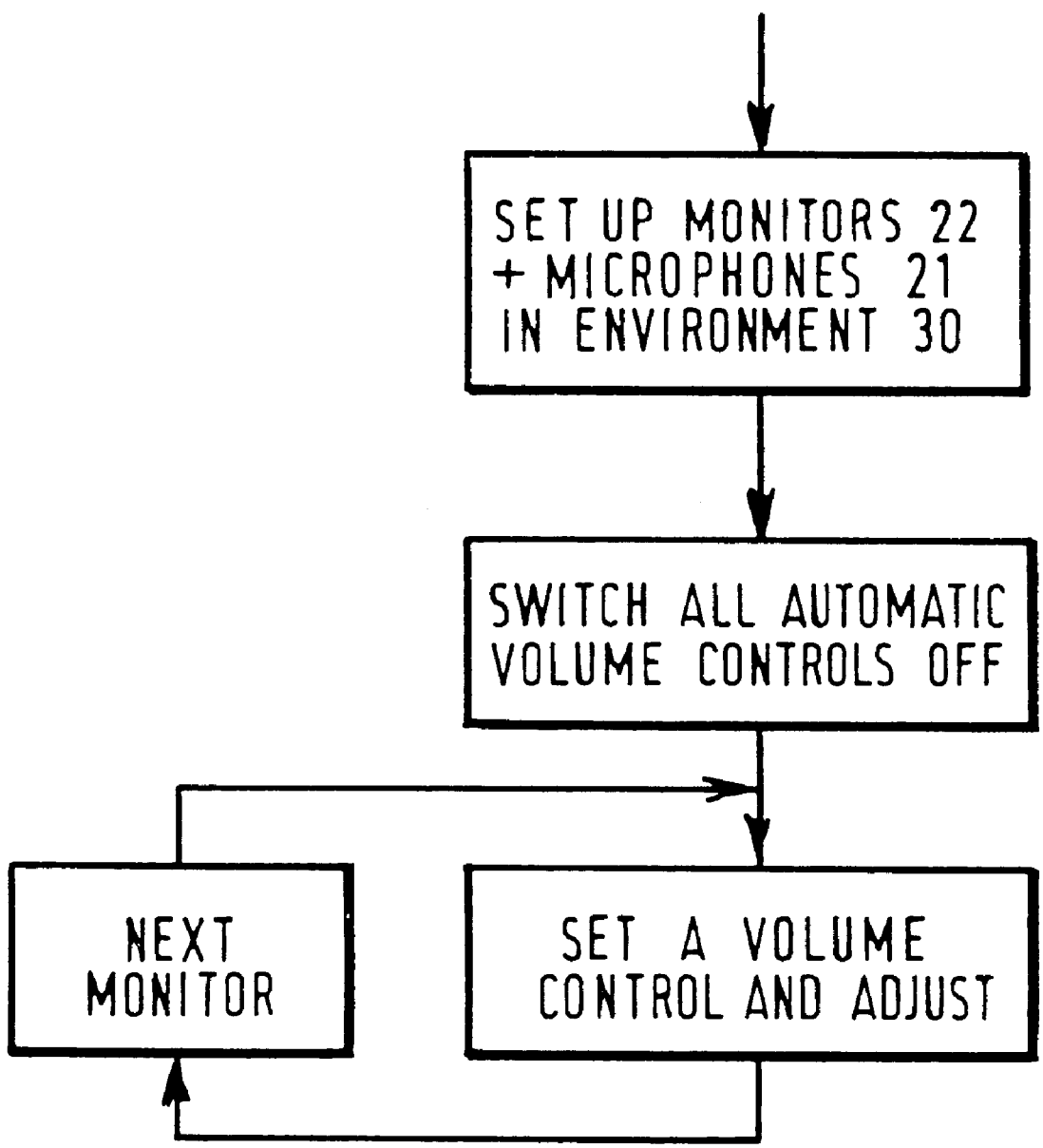
FIG. 15 shows schematically a method of setting up the apparatus of the above embodiment for operation.

Referring to FIG. 15, to set the apparatus within the acoustic environment 30, initially, all monitors 22 and associated volume control circuitry and microphones 23 are positioned as desired within the store spaced apart. The volume control circuits are rendered inactive by setting the bypass switch on each. The volume produced by each device is approximately equal.

A first monitor unit 22 is selected, and the volume control device is switched to be active. The impedance of the feedback path is adjusted, using the LED indicators as described above, until it matches (and slightly exceeds) that of the acoustic path to the micro-phone 21. When calibration is complete, the device is left active and a next device is adjusted in the same way, until all devices are adjusted. Thus, it is found preferable that, firstly, while each monitor is being adjusted, the others should be producing sound and, secondly, that after adjusting a monitor the adjustment of further monitors should take cognizance of the adjustment to that monitor.

During calibration, audio material at the level used for subsequent reproduction is supplied via the cable 25, and the acoustic environment 30 is kept as free from sources of external noise as possible, so that the only background noise sensed by the microphones 21 is due to other monitors 22.

What is claimed is:

1. A system for distributing audio-visual material over a plurality of locations in a building, the locations being spaced in different locations with any one location being acoustically affected by not only the immediate acoustic environment at that location but by the acoustic environment of at least one other of said locations, said system comprising:

a source of audio material;

a plurality of loudspeaker units each located at one of said locations and connected to said common source of audio material;

a visual display unit associated with each loudspeaker;

a video signal source for supplying video data complementary to said audio data to said display units;

a plurality of automatic volume control circuits each associated with an individual loudspeaker and arranged to control the volume produced by said associated loudspeaker;

a plurality of audio level sensing devices each connected to an individual one of said volume control circuits and located adjacent the speaker associated therewith, each volume control circuit producing a volume control signal arranged to increase or decrease the volume produced by the loudspeaker associated therewith in response to respective increases or decreases in ambient noise sensed by the sensing device associated therewith, the ambient noise being generated by the loudspeaker itself, by activity in the vicinity of the loudspeaker and by sound from at least one acoustically linked location, whereby the volume produced by each loudspeaker is responsive to ambient noise local to that loudspeaker; and means to cut out low frequency components of the ambient noise sensed by each of said sensing devices, wherein standing wave components having characteristics causing undesired gain fluctuations in said automatic volume control circuits are eliminated.

2. A system for distributing audio-visual material over a plurality of locations in a building, the locations being spaced in different locations with any one location being acoustically affected by not only the immediate acoustic environment at that location but by the acoustic environment of at least one other of said locations, said system comprising:

a source of audio material;

a plurality of loudspeaker units each located at one of said locations and connected to said common source of audio material;

a visual display unit associated with each loudspeaker;

a video signal source for supplying video data complementary to said audio data to said display units;

a plurality of automatic volume control circuits each associated with an individual loudspeaker and arranged to control the volume produced by said associated loudspeaker;

a plurality of audio level sensing devices each connected to an individual one of said volume control circuits and located adjacent the speaker associated therewith, each volume control circuit producing a volume control signal arranged to increase or decrease the volume produced by the loudspeaker associated therewith in response to respective increases or decreases in ambient noise sensed by the sensing device associated therewith, the ambient noise being generated by the loudspeaker itself, by activity in the vicinity of the loudspeaker and by sound from at least one acoustically linked location, whereby the volume produced by each loudspeaker is responsive to ambient noise local to that loudspeaker; and means for controlling a maximum level of the audio material reproduced by the plurality of loudspeaker units in dependence upon the ambient noise level sensed by the respective audio level sensing device associated therewith, wherein said maximum level of the audio material is limited so as not to exceed a threshold level applied to the output of said loudspeaker units.

3. A system according to claim 2, wherein said threshold level is set at a level well above any normally reproduced level of said audio material in the absence of ambient noise.

4. A system for reproduction of audio-visual information in a plurality of different zones in an enclosure, comprising:

a plurality of audio-visual output apparatus each comprising a display device for displaying visual information and a loudspeaker for outputting audio information, each said audio-visual output apparatus being located in a respective different one of the zones in the enclosure for providing audio-visual information to members of the public within said respective zone, adjacent ones of said zones being in acoustic communication with each other such that the ambient sound level within one of said zones is affected by the ambient sound level in an adjacent one of said zones;

a common transmission apparatus operable for producing electrical signals representing audio-visual information, said common transmission apparatus being connected to each of said plurality of audio-visual output apparatus for supplying said electrical signals thereto for the display of common visual information on the display devices of said plurality of audio-visual output apparatus and for the production of common audio information on the loudspeakers of said plurality of audio-visual output apparatus;

a plurality of electrically controlled automatic volume control circuits each connected to a respective one of said loudspeakers for controlling the volume of the audio information which is output thereby in response to said electrical signals supplied thereto from said common transmission apparatus;

a plurality of ambient sound sensing devices each connected to a respective one of said plurality of automatic volume control circuits and arranged to sense the ambient sound level within the zone in which the respective loudspeaker is located and to produce an electrical control signal dependent upon said sensed ambient sound level, each automatic volume control circuit being responsive to the respective electrical control signal to increase and decrease the volume of its associated loudspeaker in accordance with increase and decrease of the ambient sound level in the respective zone; and means to cut out low frequency components of the ambient sound sensed by each of said sensing devices, wherein standing wave components having characteristics causing undesired gain fluctuations in said automatic volume control circuits are eliminated.

5. A system for reproduction of audio-visual information in a plurality of different zones in an enclosure, comprising:

a plurality of audio-visual output apparatus each comprising a display device for displaying visual information and a loudspeaker for outputting audio information, each said audio-visual output apparatus being located in a respective different one of the zones in the enclosure for providing audio-visual information to members of the public within said respective zone, adjacent ones of said zones being in acoustic communication with each other such that the ambient sound level within one of said zones is affected by the ambient sound level in an adjacent one of said zones;

a common transmission apparatus operable for producing electrical signals representing audio-visual information, said common transmission apparatus being connected to each of said plurality of audio-visual output apparatus for supplying said electrical signals thereto for the display of common visual information on the display devices of said plurality of audio-visual output apparatus and for the production of common audio information on the loudspeakers of said plurality of audio-visual output apparatus;

a plurality of electrically controlled automatic volume control circuits each connected to a respective one of said loudspeakers for controlling the volume of the audio information which is output thereby in response to said electrical signals supplied thereto from said common transmission apparatus;

a plurality of ambient sound sensing devices each connected to a respective one of said plurality of automatic volume control circuits and arranged to sense the ambient sound level within the zone in which the respective loudspeaker is located and to produce an electrical control signal dependent upon said sensed ambient sound level, each automatic volume control circuit being responsive to the respective electrical control signal to increase and decrease the volume of its associated loudspeaker in accordance with increase and decrease of the ambient sound level in the respective zone; and means for controlling a maximum level of the common audio information reproduced by the loudspeakers in dependence upon the ambient noise level sensed by the respective audio level sensing device connected thereto, wherein said maximum level of the common audio information is limited so as not to exceed a threshold level applied to the output of said loudspeakers.

6. A system according to claim 5, wherein said threshold level is set at a level well above any normally reproduced level of said common audio information in the absence of ambient sound.

* * * * *